United States Patent [19]
Battarel

[11] Patent Number: 4,860,008
[45] Date of Patent: Aug. 22, 1989

[54] RADIATION INTERRUPTION KEYBOARD

[76] Inventor: Claude Battarel, 26120 Chabeuil, France

[21] Appl. No.: 39,948

[22] Filed: Apr. 20, 1987

[30] Foreign Application Priority Data

Apr. 22, 1986 [FR] France ............................ 86 05774

[51] Int. Cl.⁴ ............................................. G08C 21/00
[52] U.S. Cl. ......................................... 341/31; 341/22; 250/221
[58] Field of Search ............ 340/365 P, 365 R, 365 S, 340/712; 250/221; 341/22, 31; 400/479, 477

[56] References Cited

U.S. PATENT DOCUMENTS 3,603,982  9/1971  Patti .
3,648,050  5/1972  Koo ...................... 341/31
3,767,022 10/1937  Olson ................... 340/365 P
3,856,127 12/1974  Halfon et al. .......... 341/31
4,417,824 11/1983  Paterson et al. ........ 340/365 P
4,480,182 10/1988  Ely et al. .............. 340/365 P
4,641,026  2/1987  Garcia, Jr. ............ 340/365 P
4,912,092 12/1987  Boldridge, Jr. et al. ... 340/365 S

FOREIGN PATENT DOCUMENTS 0113223 7/1984 European Pat. Off. .
2095447 9/1982 United Kingdom .

Primary Examiner—David K. Moore
Assistant Examiner—M. Fatahiyar
Attorney, Agent, or Firm—Stevens, Davis, Miller & Mosher

[57] ABSTRACT

A radiation interruption keyboard is provided including a key matrix, a series of light emitting diodes and a series of photodiodes. With each diode is associated a column along which the light radiation propagates in a hollow channel. With each photodiode is associated a line along which the light radiation propagates in a strip made from a transparent material. Each strip has a deflecting area for deflecting the radiation from the light emitting diodes towards the corresponding photodiode. Upstream of each deflection area, in the path of the light beam, and in direct view of the corresponding light emitting diode is a flap for interrupting the radiation controlled by a key. The light emitting diodes are controlled sequentially and cyclically.

11 Claims, 8 Drawing Sheets

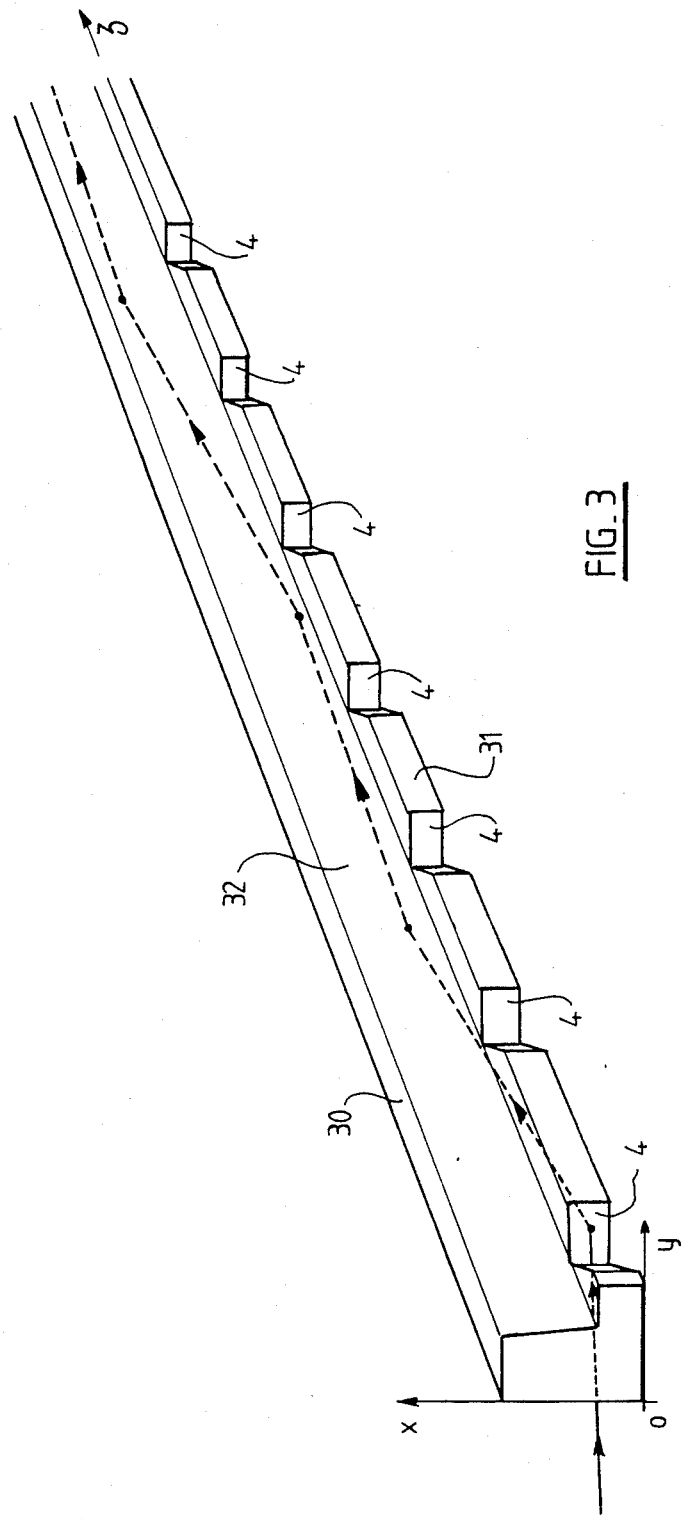

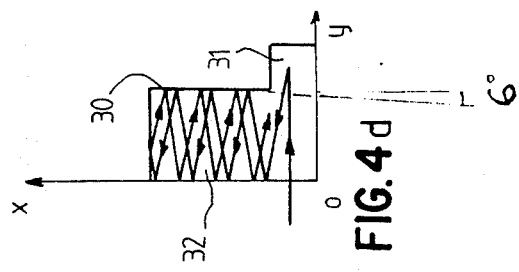
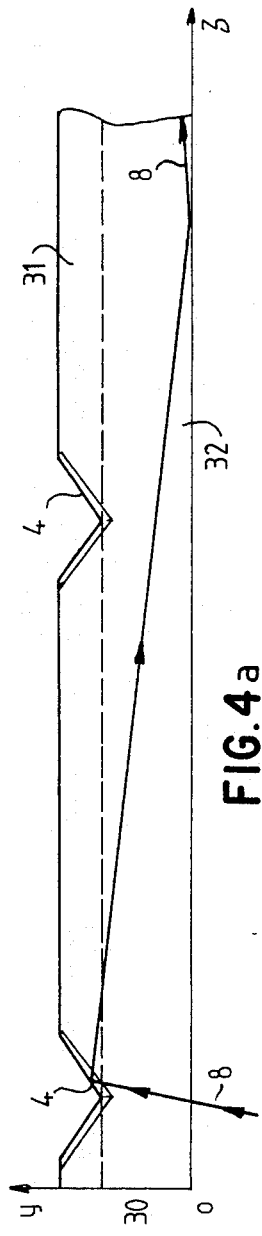
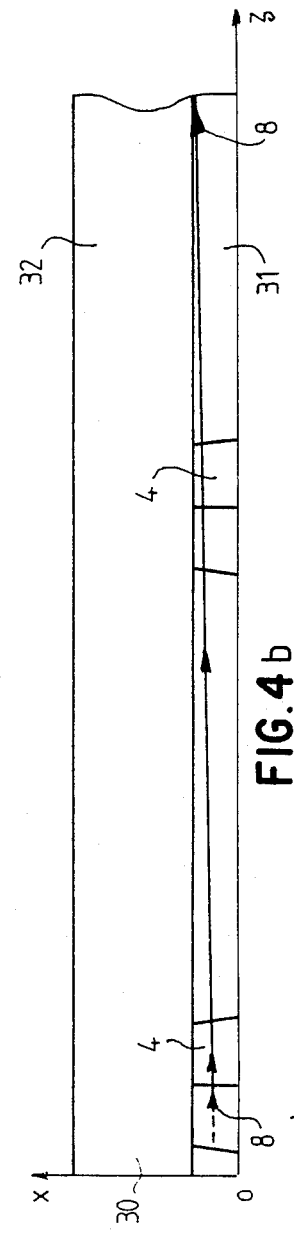
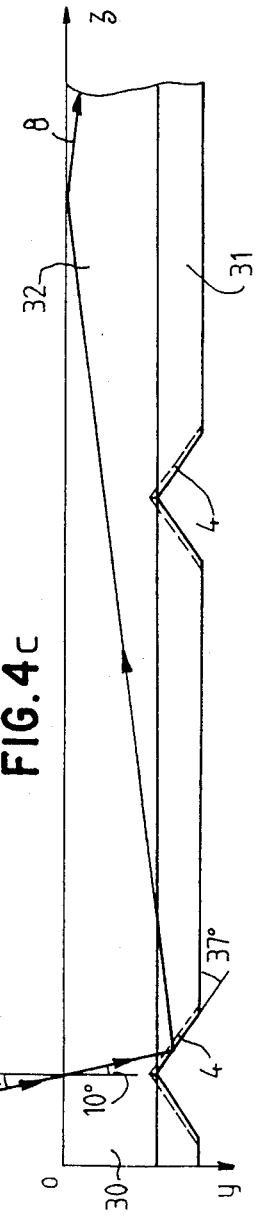

RADIATION INTERRUPTION KEYBOARD

BACKGROUND OF THE INVENTION

1. Field of the Invention

The present invention relates to a keyboard including a key matrix, a radiation emitter for each column of keys, a radiation receiver for each line of keys, means disposed at each intersection of a column and a line for deflecting the radation from the corresponding emitter to the corresponding receiver, means controlled by each key for interrupting the radiation of the corresponding emitter and means for controlling the emitters sequentially and cyclically.

With such a keyboard, alphanumeric data can be fed in manually into a word processing machine, a computer, or a terminal connected to a telecommunications network for example.

2. Description of the Prior Art

Such a keyboard is already known, described in U.S. Pat. No. 4,417,824. In this keyboard, the radiation considered is light radiation, each column includes a first light guide made from a transparent material having an index greater than that of air, inside which the light emitted by the corresponding emitter propagates and each line includes a second light guide made from the same material as the first guide and inside which light received by the corresponding receiver propagates. Each means for deflecting the radiation from an emitter to a receiver includes, in the first guide, or emission guide, two reflecting surfaces for causing a part of the light emitted to leave the emission guide in a direction parallel to that of the second guide and, in the reception guide, a reflecting surface for causing the light leaving the emission guide to enter. Each interruption means includes an opaque flap which is interposed between the emission guide and the reception guide for interrupting the light radiation.

Such a keyboard has several drawbacks. First of all, since the transparent material used for the guides is not perfect, the light propagates therein with attenuation. In addition, in order to be deflected, the radiation from the emitter undergoes three reflections. Moreover, in order to enter then leave the emission guide this radiation must cross an air-transparent medium interface then a transparent medium-air interface. The same goes for entering then leaving the reception guide. Now, each reflection or interface passage gives rise to light energy losses. Thus, after propagation, reflections and interface crossings, the light portion emitted by an emitter which is received by a receiver is relatively small. This reduces the operating reliability of the keyboard and requires the use of powerful sources and sensitive sensors. Furthermore, the use and positioning of emission guides having a relatively complex shape increase the manufacturing costs.

The European application No. 0 151 022 describes a matrix keyboard including a light emitter per column and a receiver per line and means for controlling the emitters sequentially and cyclically. In this keyboard, the light propagates in air, inside hollow and rectilinear channels corresponding to the columns and to the lines. Such a keyboard has then none of the above drawbacks. However, since the light propagates in a straight line, and since the columns are substantially perpendicular to the lines, it is not possible to use, as in U.S. Pat. No. 4,417,824, keys each controlling a single opaque flap. In fact, in the absence of means for deflecting the light radiation from the emitters towards the receivers, no receiver ever receives light from an emitter. Thus, in this keyboard, keys are used which each control the positioning, at the intersection of a column and a line, of means for deflecting the light radiation from the corresponding emitter to the corresponding receiver. These deflection means are, in this case, formed by a reflecting surface slanted with respect to the propagation direction of the light in the column, so as to deflect a part of the light emitted through an angle of substantially 90°, in the direction of the line. So that the pressing of the key does not prevent light from passing through the channels, either a totally reflecting surface is used controlled by the key for insertion in a part only of the section of the propagation channel, or a semireflecting surface is used controlled by the key for insertion in the whole of the section of the propagation channel. In both cases, even if a key is pressed, it does not completely prevent light from passing, which means that keys pressed downstream, in the direction of propagation of the radiation, in the same column, or keys pressed upstream, in the same line, can be recognized.

A keyboard such as the one which has just been described, although it does not have the defects inherent in keyboards using light guides made from a transparent material having an index greater than that of air, has however other drawbacks. First of all, each of the keys, since it controls the positioning of a mobile reflectign surface whose slope angle must remain strictly constant, is mechanically more complicated than a key which controls the positioning of an opaque flap whose slope angle is not critical. Moreover, although the pressing of the key does not cause cancellation of the light downstream of this key, it causes attenuation thereof in relatively high proportions. This reduces the operating reliability of the keyboard and leads then also to the use of powerful sources and sensitive sensors.

The aim of the present invention is to overcome the preceding drawbacks.

SUMMARY OF THE INVENTION

For this, it provides a keyboard of the above defined type, wherein each interrupting means is in direct view of the corresponding emitter and each deflection means is disposed, in the path of the beam from the corresponding emitter, downstream of the associated interrupting means.

In the preceding sentence, it is clear that the deflection means is disposed downstream of the operating position of the interrupting means.

In the keyboard of the invention, there is no loss of light in the emission lines due to the use of a transparent material guide, the pressing of a key does not impede recognition of a key situated downstream in the same emission line, and each key remains mechanically very simple.

Advantageously, each line includes means for guiding the radiation deflected by the deflection means.

The guide means guide the radiation so that the pressing of a key does not impede the recognition of a key situated upstream in the same line;

Advantageously, said radiation is further formed by light radiation and the guide means include a strip of material transparent to said radiation, and each deflection means includes a reflecting surface of said strip.

In such a keyboard, between an emitter and a receiver, the light radiation passes through an air-transparent material interface, is reflected then passes through a transparent material-air interface. The light crosses then two interfaces and is reflected once. In the keyboard known from U.S. Pat. No. 4,417,824, it crosses four interfaces and is reflected three times. The losses are therefore appreciably smaller than in this known keyboard.

BRIEF DESCRIPTION OF THE DRAWINGS

The present invention will be better understood from the following description of a preferred embodiment of the keyboard of the invention, with reference to the accompanying drawings in which:

FIG. 3 is a perspective view of a strip from the keyboard of FIG. 1,

FIGS. 4a, 4b, 4c and 4d show a bottom, front, top and profile view, respectively, of the strip of FIG. 3, FIGS. 5a and 5b each show a simplified view, in section, of two keys of the keyboard of FIG. 1 belonging to different lines.

DESCRIPTION OF THE PREFERRED EMBODIMENT

Figure 1:
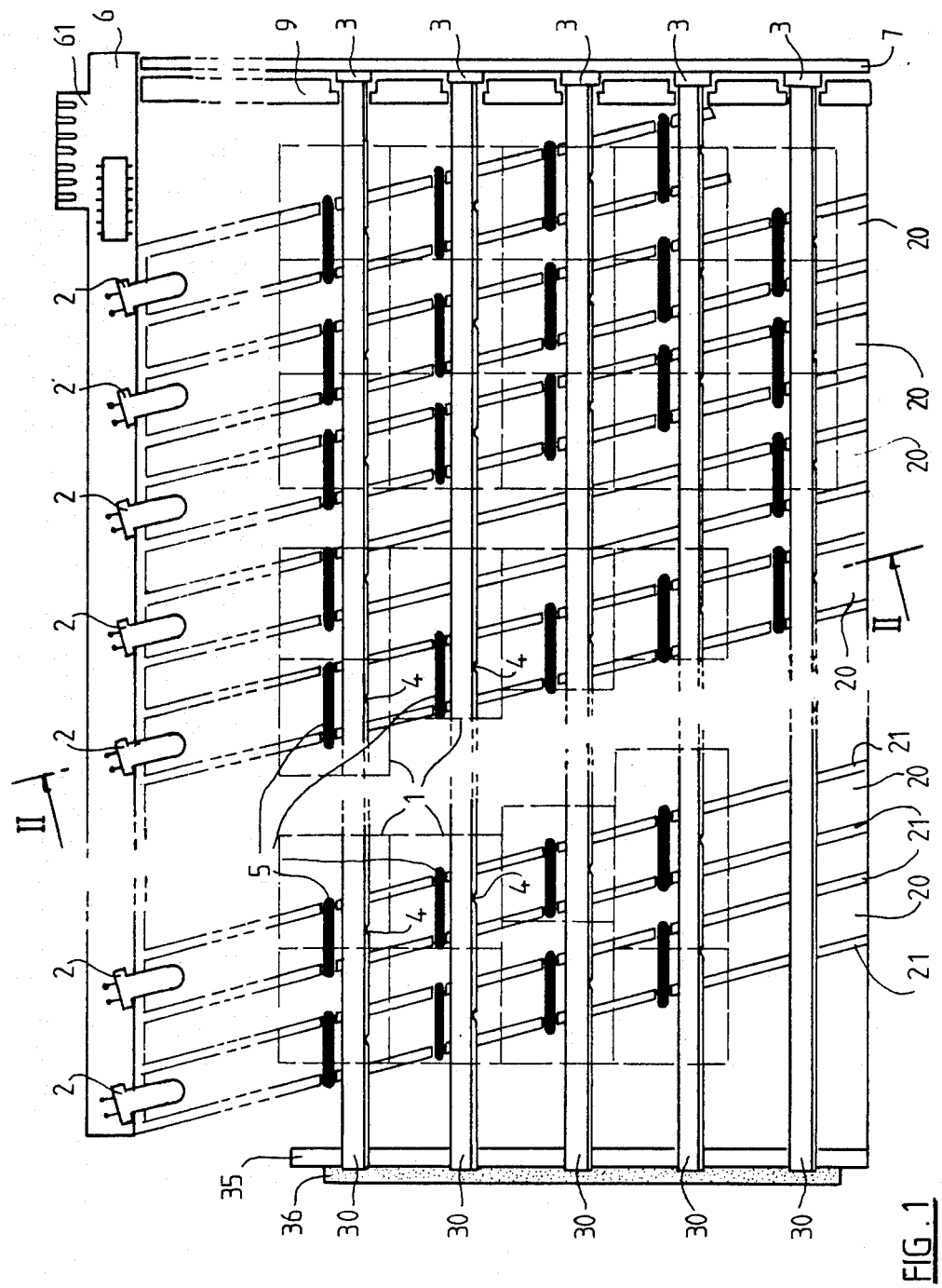
FIG. 1 shows the lower part of the keyboard of the invention.

Referring to FIG. 1, a keyboard for manually feeding data into a data processing machine, for example, includes a matrix of keys 1, shown with broken lines in FIG. 1. To each column 20 of the key matrix there corresponds a radiation emitter, in this case a light emitting diode 2, disposed so that the keys of the column 20 are in the path of the light beam which it emits. To each line 30 of the key matrix there corresponds a receiver receiving the emitted radiation, in this case a photodiode 3, disposed so as to receive light radiation coming from each of the keys of line 30. At the intersection of each column 20 and each line 30 are disposed means 4, which will be described further on, for deflecting a part of the light emitted by the corresponding light emitting diode 2, to the corresponding photodiodes 3. Each key controls a means for switching the light beam, in this case an opaque flap 5 which is inserted in the path of this beam.

Assuming that at a given moment only the LED 2 of rank j is actuated for emitting a light beam, examination of the output signals of photodiodes 3 gives information concerning the keys 1 of the column of rank j which have been pressed. For example, if the photodiode of rank k delivers a zero output signal, this means that the key situated at the intersection of the column of rank j and of the line of rank k has been pressed. By controlling the LEDs 2 sufficiently rapidly, sequentially and cyclically, and by reading simultaneously of photodiodes 3, an electronic circuit, for example a microprocessor, including here printed circuit boards 6 and 7, delivers then to a connector 61 an output signal corresponding at all times to the keys which have been pressed, and provides the function known by a man skilled in the technique as "N key roll-over".

An electronic circuit of this type is within the scope of a man skilled in the art and is identical to the one described in U.S. Pat. No. 4,417,824, for example.

In the keyboard of the invention, a rectilinear hollow channel, defined by walls 21 which are here reflecting, corresponds to each column 20. Each channel 20 is disposed in the axis of radiation of each LED 2.

The LEDs 2 have in this case a narrow radiation pattern, in a first approximation contained in an angle of ±10° and of a total radiated power of the order of 20 milliwatts for an energization current of 100 milliamps at 20° Celsius. Such diodes, emitting at the wave length of 930 nanometers, are currently available.

A light radiation guide, here a strip made from a transparent material having an index greater than that of air, corresponds to each line 30. Each strip 30 is disposed in the reception axis of each photodiode 3. The photodiodes 3 are here of the PIN type. Strips 30 are formed here from an acrylic type material having an index substantially equal to 1.5, at the wave length used. Channels 20 and strips 30 form here an angle of the order of 76°.

Figure 2:
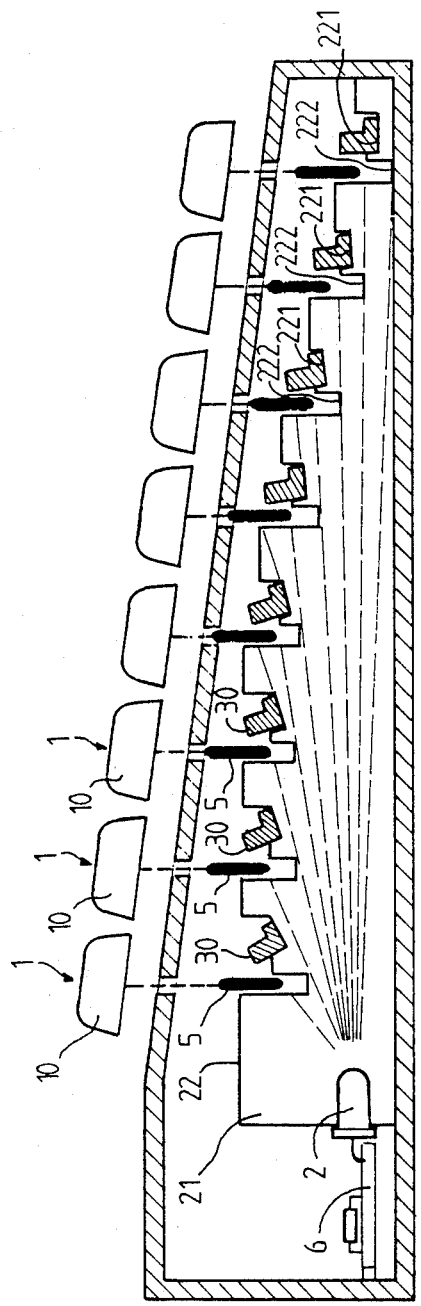
FIG. 2 shows a sectional view through line II—II of FIG. 1.

As shown in FIG. 2, which is a sectional view of a channel 20, the walls 21, here fixed to the bottom of the case of the keyboard, have an upper edge 22 adapted for supporting strips 30. Strips 30 are all identical and have a cross section substantially in the form of an L. Strips 30 are engaged in recesses 221 in the upper edge 22 of each wall 21, positioned and shaped so that the surface corresponding to the lower part, situated on the right, of the substantially vertical bar of the L of the cross section of each strip 30 is in direct view of the light emitting diode 2.

The upper edge 22 of each wall 21 also includes recesses 222 which allow each flap 5 connected to the cap 10 of each key 1 to come in the path of the light beam between the LED 2 and each strip 30. In the radiation blocking or interrupting position, each flap 5 is then in direct view of the LED 2. The recesses 221 and 222 in the upper edge 22 of wall 21 are designed as follows.

With the spacing between flaps 5 set by the pitch between keys 1, here close to 19 mm, the recess 222 for flap 5 the furthest away from LED 2, called hereafter first flap, is adapted so that, in the pressed position, this flap 5 practically touches the bottom of the case of the keyboard. As will be seen further on, a stroke of 4 mm for flap 5 is sufficient, so as to cause infallibly the blacking out or illumination of a zone of a height equal to 2 mm of strip 30. The position of the recess 221 for the corresponding strip 30, or first strip 30 is then provided accordingly. Its shape is adapted so that the direction of the substantially vertical bar of the L of the cross section of the first strip 30 has a direction substantially perpendicular to that of the light beam between the LED 2 and this first strip 30.

Recess 222 of the next flap 5, or second flap 5, is adapted so that, in the pressed down position, this second flap 5 does not come in the path of the light beam between the LED 2 and the first strip 30. The second flap 5 will then be further away from the bottom of the case than the first flap 5. Recess 221 of the second strip 30 is adapted by following the same rules as before. Then, considering the slope of the light beam between the LED 2 and the second strip 30, with respect to the light beam between this diode 2 and the first strip 30, the position of the second strip 30 is slightly rotated with respect to the position of the first strip 30.

This procedure is followed, step by step, for all the recesses 221 and 222 of the edge 22 of wall 21. The different light beams from the LED 2 which intercept the different flaps 5 and strips 30 are contiguous in the plane of FIG. 2. Thus an arrangement of strips 30 and flaps 5 is obtained which follows a curve in this plane. Since the surface of the assembly of caps 10 for the keys 1 of the keyboard is generally flat, the length of the control members between each cap 10 and its flap 5 will be variable. These control members, simply shown by broken lines in FIG. 2, will be described further on.

As can be seen in FIG. 2, the directions of the substantially vertical bars of the L of the cross sections of strips 30 are not strictly perpendicular to the directions of light beams between the LED 2 and the strips 30. This is due to the fact that, taking into account the particular shape of strips 30 which will be described further on, an experimental adjustment of the position of these strips about the above defined position, which adjustment is within the scope of a man skilled in the art, allows the optical transmission between LED 2 and each photodiode 3 to be optimized.

Coming back now to FIG. 1, the photodiodes 3 are protected from parasite light by a screen 9 of matt black color absorbing the light which rises a few millimeters along strips 30. This screen 9 also provides precise positioning of strips 30 with respect to the photodiodes.

The strips 30 also rest on a plate 35, with recesses similar to those of walls 21, and is disposed opposite the photodiodes 3. A sheet of elastomer foam 36 urges strips 30 against the photodiodes 3.

As can be seen in FIGS. 3 and 4, each strip 30 is a cylinder with axis Oz including a body 32 and a flange 31 both of a general parallelepipedic shape. Body 32 corresponds to a bar of the L of the cross section, which bar extends along an axis Ox, and the flange 31 corresponds to the other bar of this L, which bar extends along an axis Oy. The reference Ox, Oy, Oz is a trirectangular reference. The section of body 32 of the strip is here a rectangle, 4.5 mm in height and 3 mm in width. The section of flange 31 of the strip is here a square of 1.5 mm per side. The length of the strip depends on the number of keys per line of the keyboard, and on the pitch of these keys. It is here of the order of 40 cm or so.

In flange 31 are formed, at distances along axis Oz equal to the pitch between the keys, notches with axis substantially parallel to the axis Ox. The face 4 of these notches intended to be on the photodiode 2 side is a flat face whose intersection with the plane yOz forms an angle, here of 37° with the positive half axis Oz and an angle of 53° with the positive half axis Oy, and whose intersection with the plane xOy forms here an angle of 6° with the negative half axis Ox and an angle of 84° with the negative half axis Oy.

Figure 5A:
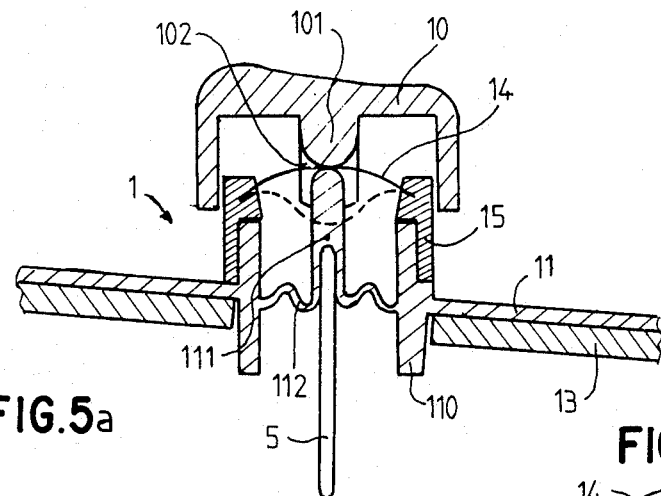
FIG. 5c shows a top view of the ring of the keys of FIGS. 5a and 5b.
FIG. 5d shows four configurations of the flap of the keys of FIGS. 5a and 5b.
Figure 5C:
Figure 5B:
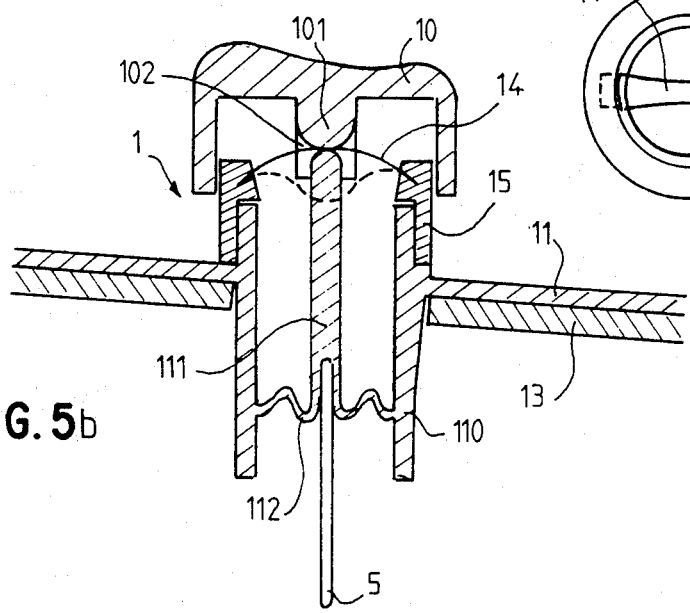

As shown in FIG. 5a and FIG. 5b, the control members for each cap 10 and the corresponding flap 5 form part of a single flexible web 11 made from a plastic material of elastomer type which covers the whole of the case of the keyboard, without any opening towards the inside thereof, which thus seals the case from keys wearing dust and from external pollution.

Web 11 includes, at the position provided for each key 1, a substantially cylindrical key body 110 and, along the axis of the key body 110, a vertical finger 111 connected to the key body 110 by a bellows 112, of the known corrugated type. As can be seen in FIGS. 5a and 5b, the height of the key body 110 and that of finger 111 are variable and depend, as has been mentioned, on the position of the line to which the corresponding key 1 belongs.

Web 11 is here supported by a rigid plate 13 including openings for passing therethrough the key bodies 110, whose lower surface rests on the upper edge of the dividing walls 21.

Cap 10 is provided on the inside with a rounded projection 101 which bears against the center of a spring blade 14 embedded in a hard plastic ring 15 on which the internal edge of cap 10 may slide. This ring 15 rests on the key body and provides rigidity for the key.

Spring 14 is a thin blade, preferably a blade of an amorphous alloy ribbon of the nickel-iron-chromeboron type of a thickness of substantially 30 microns, cut out chemically or by stamping so as to form a strip smaller in width in its central part than at its ends, as shown in FIG. 5c. The ends of blade 14 are anchored in the ring so that the blade 14 forms an arc of a circle, with a camber of about 2 mm. When the key is pressed, blade 14 is deformed as shown by the broken line, providing a considerable tactile sensation which avoids partial pressing or involuntary repetition.

The projection 101 on cap 10 is extended on two sides by extensions 102 which fit into the upper part of finger 111.

Figure 5D:
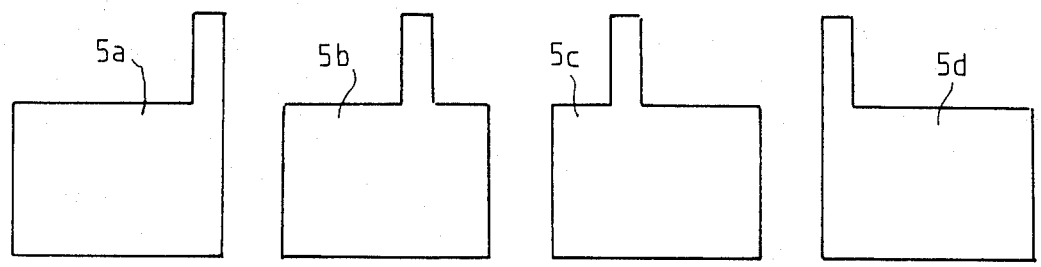

Flap 5 black in color, is here embedded in the lower part of finger 111. It may here have four different shapes 5a, 5b, 5c and 5d, illustrated in FIG. 5d, for adapting to the particular configuration of caps 10 on the keyboard, while keeping columns 20 strictly rectilinear in the lower part of the case.

The operation of the keyboard which has just been described is as follows. When an LED 2 is actuated for emitting light radiation, this radiation is propagated in a straight line in the corresponding hollow channel 20, as far as strips 30 associated with the non pressed keys 1 of the column, and as far as the flaps 5 associated with the pressed keys 1 of the column. Since the case is sealed through web 11, no dust can disturb the light propagation. Since moreover no interface crossing or reflection can affect the propagation, the attenuation of the light radiation between LED 2 and strips 30, or flaps 5, is practically zero. This result is obtained because the flaps 5 corresponding to the pressed keys, and consequently strips 30 corresponding to the non pressed keys 1, are in direct view of the LED 2. The walls 21 are here reflecting only for reflecting the light emitted by the LEDs 2 out of its main radiation pattern by a few degrees.

When a key 1 is not pressed, the light radiation penetrates into the correspondig strip 30. Its path is shown in FIGS. 3 and 4, materialized by the light ray bearing the reference 8. As can be seen in FIG. 4, because the angle between strip 30 and column 20 is here 76°, ray 8 arrives in plane xOz at an incidence here of the order of 14°. Since strip 30 is disposed so that the lower part of body 32, situated oposite flange 31, is illuminated, ray 8, slanted at 10° with respect to the axis Oy after refraction by the air input-transparent material interface of strip 30, strikes surface 4 from which it is reflected. Considering the position of this latter, ray 8 is reflected in a direction close to that of axis Oz. Since the photodiode 2 is disposed in the direction of axis Oz, we may say then that the surface 4 forms a means for deflecting the light radiation from the LED 2 towards the photodiode 3.

The orientation of surface 4 is such that the light ray 8 is reflected in a direction whose projection on plane xOz is slanted slightly with respect to axis Oz, so as to be directed also towards the increasing x's. The result is as is shown in FIG. 4d that the ray, after a first total reflection from the wall merging with the plane xOz, remains imprisoned in body 32 over a fairly long distance. In fact, it must here undergo about seven total reflections from the walls parallel to the plane xOz of body 32 before being completely reflected on the upper wall parallel to the plane yOz of body 32, which wall reflects it back to the lower part of body 32, which it reaches after about seven more reflections.

Strict calculation shows that, in the case described, the total reflections from the walls of body 32 parallel to plane xOz occur with a period equal to 2.5 times the distance between the keys, that is to say the distance between two consecutive reflecting surfaces 4.

The result is that ray 8 can only come back, during its propagation in strip 30, to flange 31 after about 35 key pitches. Since the lines of keys of keyboards always have less than 35 keys, the orientation of the reflecting surface 4 is then such that, over the length of strip 30, the propagation of the light ray 8 takes place inside body 32 of strip 30 and not inside the flange 31. This results in a reduction of the losses in strip 30, for in body 32, of strictly parallelepipedic structure, the reflections are total and the light is guided with an attenuation due solely to the transparent material used. On the other hand, the structure of flange 31 is much more complex, taking into account the notches which are formed periodically therein so as to create reflecting surfaces 4. These irregularities would cause light leaks if it propagated therein.

Thus, the form of strip 30 is particularly judicious. On the one hand, strip 30 includes both means for deflecting the radiation, namely surface 4 and guide means, namely body 32. This allows deflection and guidance of the radiation with a minimum number of interfaces between the air and the transparent material. On the other hand, the arrangement of strip 30 and the arrangement of surface 4 are such that the deflection means spaced apart periodically along strip 30, do not unfavorably influence the propagation of the light in body 32 of strip 30.

From the practical point of view, in the case described an attenuation of 0.5 dB per key pitch has been noted. The divergence of the input beam and the imperfections of the assembly mean that a slight influence of the width of the flange can be observed on the attenuation when this latter should not theoretically occur. Progressive tapering of the flange towards the detector leads to better experimental results. For the same reasons, instead of a cylindrical shape strips 30 may have the shape of a truncated pyramid corresponding to a slight tapering towards the photodiodes.

Naturally, sealing of the case avoids the deposit of dust on the input interface in the strip, and on the output interface, here flat for good adaptation to the photodiode 2.

Figure 6A:
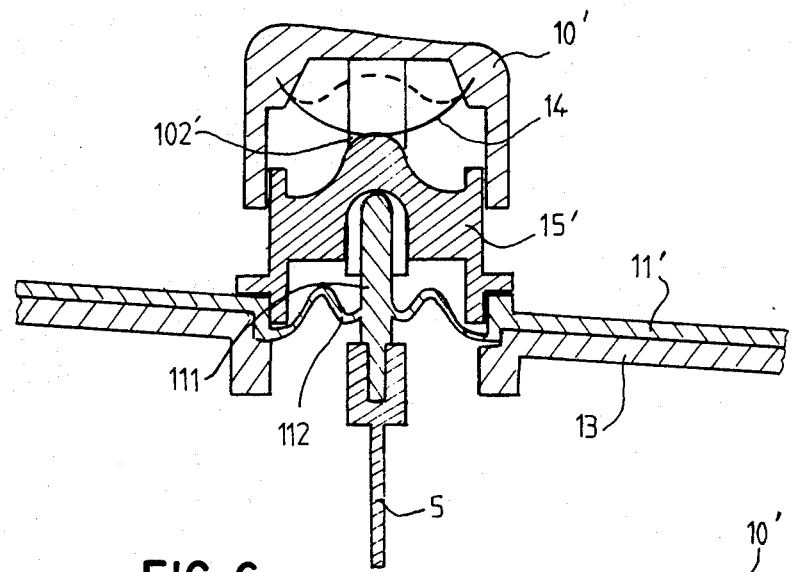
FIG. 6a shows a simplified view, in section, of a first variant of construction of the key of FIG. 5a, FIG. 6b shows a perspective view of the cap of the key of FIG. 6a, FIG. 6c shows a top view of the ring of the key of FIG. 6a, FIG. 7a shows a simplified view, in section, of a second variant of construction of the key in FIG. 5a, FIG. 7b shows a top view, in section, of the key of FIG. 7a, FIG. 8a shows a perspective view of a first variant of construction of the strip of FIG. 3.
Figure 6B:
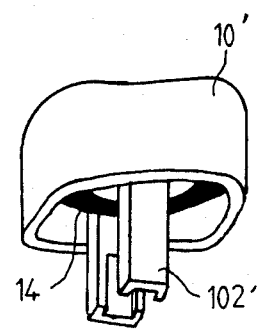
Figure 6C:
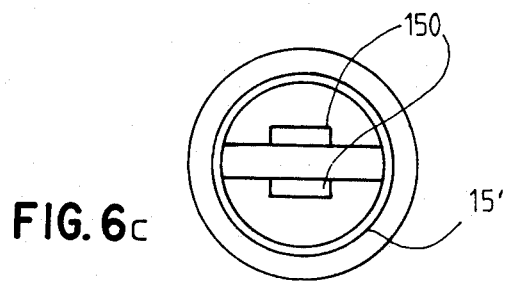

FIGS. 6 show a first variant of construction of keys 1. In FIGS. 6, the elements identical to those of FIG. 5 bear the same reference. In the construction of FIG. 6, web 11' does not comprise a key body. The spring blade 14 is mounted in cap 10', which also includes two inner sliding lugs 102'. Ring 15' is a solid ring provided with two openings 150 for guiding the sliding lugs 102'. With respect to the construction shown in FIGS. 5, with the variant shown in FIG. 6, a longer spring blade 14, a wider bellows 112 and better vertical guiding of the key may be provided.

Figure 7A:
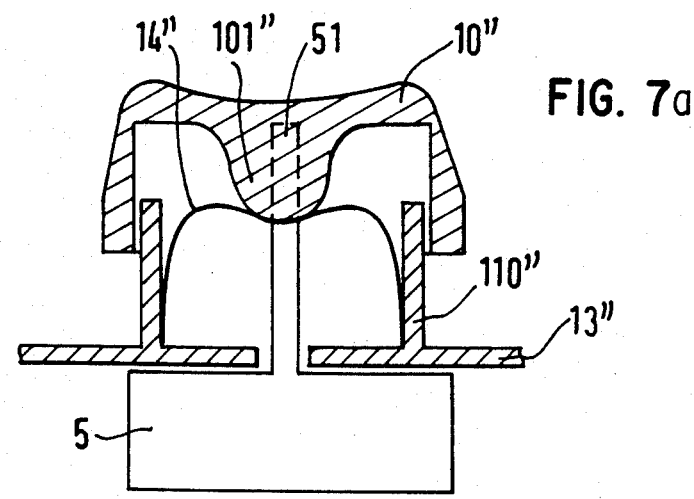
Figure 7B:
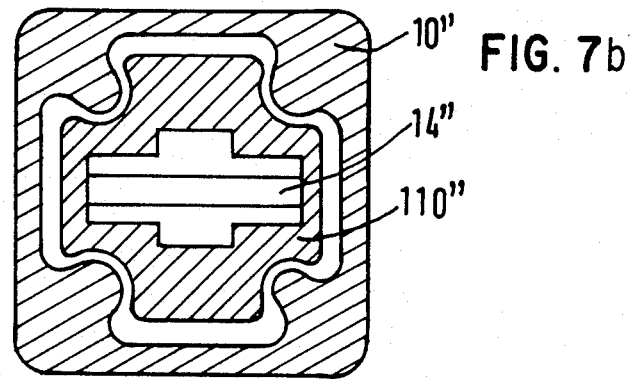

FIGS. 7 show a second variant of construction of keys 1. In this variant, each key body 110" is secured to the upper rigid plate 13" of the keyboard. All the key bodies 110" are thus obtained simultaneously during molding of plate 13". Cap 10" slides outside the key body 110" and, consequently, any dust due to wear will fall outside body 110" and will not disturb the transmission of light inside the keyboard, which means that a flexible web, like webs 11 and 11' of FIGS. 5 and 6, is not necessary.

Spring 14" is here a simple ribbon segment, of a width of 1 or 3 mm, inserted in the key body 110", in abutment against plate 13". Spring 14" is nipped or bonded at its ends. Inside cap 10", a rounded projection 101" bears against spring 14". The profile of projection 101" is adjusted so as to obtain the desired tactile sensation during pressing of the key. Rod 51 of flap 5 is fixed, for example by snap fitting, on projection 101".

Figure 8A:
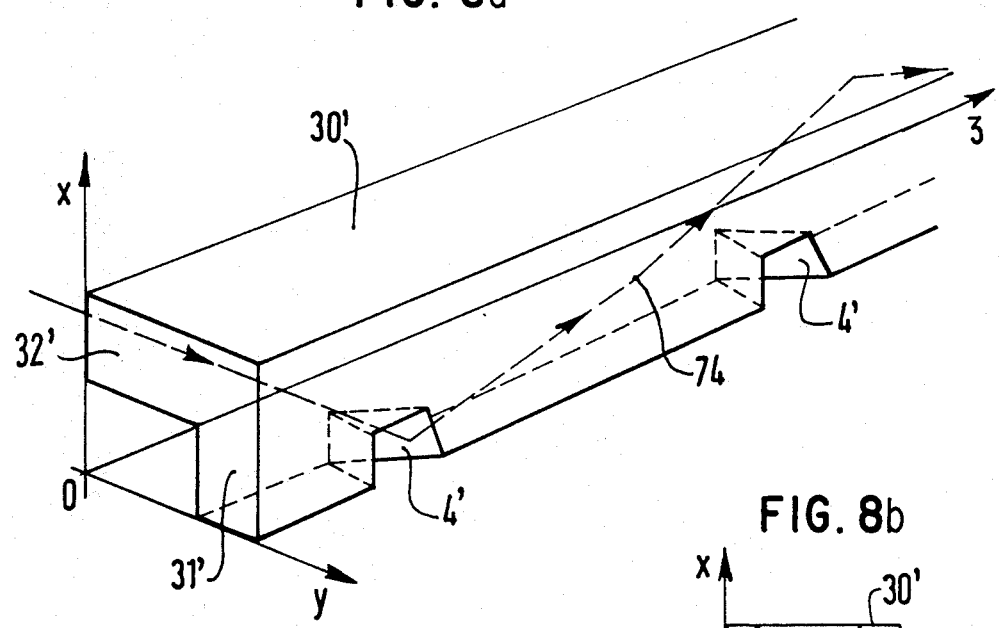
FIG. 8b shows a profile view of the strip of FIG. 8a, and FIG. 9 shows a profile view of a second variant of construction of the strip of FIG. 3.
Figure 8B:
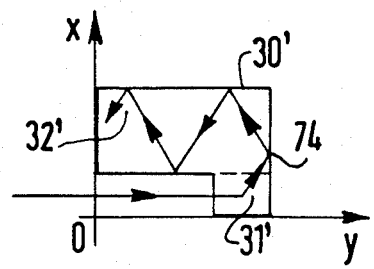

FIGS. 8 show a first variant of construction of the strips. In this variant, each strip 30' is still substantially in the form of a cylinder, with a cross section substantially in the form of an L, and having a body 32' and a flange 31' comparable to those of strip 30 of FIG. 3. However, as can be seen in FIG. 8, flange 31' extends vertically, here from the side of body 32' the furthest away from the LED 2. Notches are formed in flange 31' for providing the reflecting surfaces 4', slanted so that the reflected radiation is guided inside the body 32', after total reflection at 74 from the vertical face of body 32' the furthest away from the LED 2. This variant is particularly well adapted to the construction of flat keyboards in which columns and strips are perpendicular.

Figure 9:
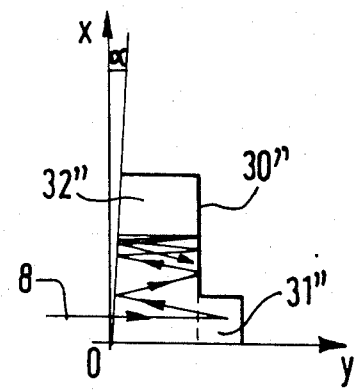

FIG. 9 shows a second variant of construction of the strips. In this variant, each strip 30", adapted so as to be disposed like strip 30 is provided with a body 32" trapezoidal in section, the two substantially vertical faces of body 32" no longer being parallel but drawing together towards the top, at an angle α of a few degrees. Thus, the guided radiation is spatially more concentrated, which offers better detection.

From a practical point of view, it will be noted that the simple shape of strips 30, 30' or 30", including only flat surfaces without re-entrant parts, makes them easy to mold and contributes to a reduction of the costs of manufacturing the keyboard of the invention.

Naturally, the scope of the invention is not limited to the keyboard which has just been described.

First of all, and considering the different possible shapes of flaps 5, the arrangement of the keys, offsettable from one row to the next by a multiple of the quarter of a pitch between keys, may be any desired and in particular conformable to the alphanumeric standard of typewriters, or else may correspond to a regular arrangement for forming a square or a rectangle.

Then, a symmetrical operation of that described may also be envisaged, which symmetrical operation corresponds to the transmission of light on pressing a key, at the cost of an obvious transformation of the key mechanism.

Similarly, the LED 2 may be replaced by laser diodes, and the photodiodes by phototransistors, or else by devices emitting and receiving other types of electromagnetic radiations or ultrasonic radiations. The keyboard may also be strictly optical by replacing the LEDs 2 by incoming optical fibers having a numerical aperture of 0.3, for example and PIN photodiodes by a termination of the strips connected through a cone, having an angle at the apex equal substantially to 8° and of a height of 1 cm, to an optical fiber having a numerical aperture of 0.55, for example.

The invention may also be used for a keyless keyboard where the finger of the operator interrupts the light path, which thus takes the place of the flaps which have been described.

The invention may also be used for detecting and counting any objects passing through hollow passages replacing the keys, or for forming an electronic output panel, using mechanical memory keys or marker objects placed in boxes at the position of the keys, or, more generally, for any light transfer device using a strip similar to those which have been described.

What is claimed is:

1. A keyboard comprising:
   a plurality of keys arranged in columns and rows of keys;
   a respective radiation emitter for each column of keys; each said emitter being arranged in a respective hollow longitudinally extending channel corresponding to a column of keys;
   a respective radiation receiver for each row of keys;
   a plurality of deflection surfaces, each being disposed at an intersection of a column and a row for deflecting radiation from the corresponding emitter of the column to the corresponding receiver of the row;
   means associated with and controlled by each key for interrupting radiation from a corresponding emitter, each said interrupting means being in a direct unreflected light propagation path from a respective emitter thorough a respective longitudinally extending hollow channel, each deflecting surface also being disposed in said direct unreflected light propagation path and being located downstream of an associated interrupting means, and
   means for operating said emitters to generate radiation therefrom sequentially and cyclically.

2. The keyboard as claimed in claim 1, wherein each row of keys includes means for guiding the radiation deflected by a deflection surface.

3. The keyboard as claimed in claim 1, wherein each emitter emits radiation beams into a respective hollow channel which intercept different interruption means of the same column and which are contiguous in a plane perpendicular to the plane of the columns.

4. The keyboard as claimed in claim 2, wherein said radiation is light radiation.

5. The keyboard as claimed in claim 4, wherein the guide means include a strip of material transparent to said radiation, and each deflection surface includes a reflecting surface of said strip.

6. The keyboard as claimed in claim 5, wherein said strip is substantially in the form of a cylinder, whose cross section is substantially in the form of an L, having a parallelepipedic body, corresponding to a bar of said L and a substantially parallelepipedic flange corresponding to the other bar of said L, and notches are formed in the flange for providing said reflecting surfaces.

7. The keyboard as claimed in claim 6, wherein each said reflecting surface is slanted so that reflected radiation is guided over the length of the strip inside said body of the strip.

8. The keyboard as claimed in claim 1, wherein each key is provided with a return spring formed by a flexible blade mounted in an arc of a circle, whose ends are fixed and whose central part is deformable.

9. The keyboard as claimed in claim 8, wherein the flexible blade is of smaller width in its central part than at its ends.

10. The keyboard as claimed in claim 1, wherein each key includes a cap and a member for controlling each interruption means, the assembly of said control members forms part of a single flexible sealing web covering a case containing the emitters, the receivers, the deflection surfaces and the interruption means.

11. The keyboard as claimed in claim 1, wherein each key includes a cap sliding outside a key body molded in a rigid plate closing a case containing the emitters, the receivers, the deflection surfaces and the interruption means.

* * * * *